United States Patent [19]

Lohstroh et al.

[11] 4,322,821

[45] Mar. 30, 1982

[54] MEMORY CELL FOR A STATIC MEMORY AND STATIC MEMORY COMPRISING SUCH A CELL

[75] Inventors: Jan Lohstroh, Eindhoven, Netherlands; Cornelis M. Hart, Sunnyvale, Calif.

[73] Assignee: U.S. Philips Corporation, New York, N.Y.

[21] Appl. No.: 105,357

[22] Filed: Dec. 19, 1979

[30] Foreign Application Priority Data

Dec. 22, 1978 [NL] Netherlands ......................... 7812463

[51] Int. Cl.$^3$ ............................................. G11C 11/40
[52] U.S. Cl. ....................................... 365/155; 357/20
[58] Field of Search .................. 365/154, 155; 357/20; 307/291

[56] References Cited

U.S. PATENT DOCUMENTS 3,849,675 11/1974 Waaben ............................... 365/155
3,886,531 5/1975 McNeill .............................. 365/155
4,227,203 10/1980 Mikoshiba ............................ 357/20

OTHER PUBLICATIONS

Moore, "Schottky Barrier Diode Storage Cell", IBM Tech. Disc. Bul., vol. 14, No. 6, 11/71, p. 1683.

*Primary Examiner*—Stuart N. Hecker
*Attorney, Agent, or Firm*—Thomas A. Briody; Robert T. Mayer; Steven R. Biren

[57] ABSTRACT

A memory cell for integration into a static memory includes two transistors with cross-coupled base and collector regions. The collector regions are connected to p-n junction diode load elements having at least one region of polycrystalline silicon material. The collector regions of the transistors are connected to the regions of the diodes which are of the same conductivity type as the collector regions.

20 Claims, 14 Drawing Figures

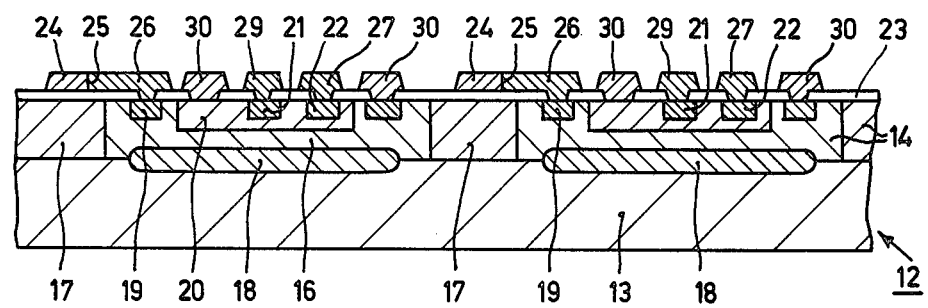
FIG.4
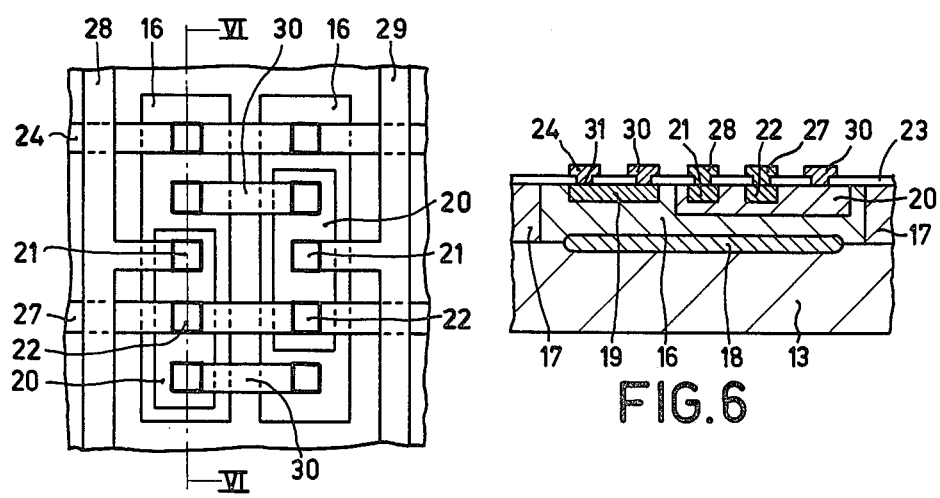
FIG.5
FIG.6

MEMORY CELL FOR A STATIC MEMORY AND STATIC MEMORY COMPRISING SUCH A CELL

BACKGROUND OF THE INVENTION

The invention relates to a static memory cell, particularly to be integrated in a static memory in large numbers, comprising a semiconductor body having two transistors with cross-coupled base and collector regions, the collector regions each being connected to a load element comprising a diode. The invention further relates to a static memory having such a memory cell.

The memory cells may be formed, for example, by generally known flip-flop circuits in which the collectors can be connected, via the load elements, to a common line (for example the supply line) and in which first emitter regions are connected in common to, for example, a current source and second emitter regions are connected to read/write lines.

For a stable flip-flop it is necessary that the loop gain in the meta stable point be larger than 1. Starting from a current-voltage characteristic of the emitter-base junction $i_c = I_o \exp(qV_{be}/kT)$ it can be found out that it follows from this condition that the impedance R of the load elements must be larger than $(kT/qi)$, where k is Boltzmann's constant, T is the absolute temperature, q is the elementary quantity of charge and i is the current.

During operation, for reading into the cell a comparatively large read current, for example, 1 mA is used in connection with the access time. With these large read currents, a load element having a comparatively small resistance could be used. In the stand-by condition in which the cell is not read but in which information should remain stored, a current which is as small as possible is conveyed through the cell in order to minimize dissipation. Two contradictory requirements are imposed upon the load element, namely a low impedance in connection with the comparatively large read currents and a high impedance in connection with the comparatively small stand-by currents. In practice, the impedance of the load element can be chosen to be such that a read current ratio/stand-by current of approximately 5 can be obtained when linear resistors are used.

Larger values for this ratio are desired for obvious reasons but usually they cannot be realized when a linear resistor is used as a load element, in particular because technologically very large resistors are difficult to make accurately and inter alia because with large resistances the read currents are restricted by the available supply voltages.

A memory cell having a non-linear load element, namely a resistor with a parallel arranged diode, is described in the article "A 1024-Bit ECL RAM with 15-ns Access Time" by Ronald Rathbone et al., published in IEEE International Solid State Circuits Conference 1976, pp. 188/189. The stand-by current may have a comparatively low value (15 μA). When reading the cell, the greater part of the current can be passed through the diode so that a higher value can be chosen for the resistor and hence a lower value for the stand-by current than in the absence of the diode. In the article by A. Hotter et al "A high-speed low-power 4096×1-Bit bipolar RAM" published on the IEEE International Solid State Circuits Conference 1978, Digest of Technical Papers, pp. 98/99, it is stated that a read current ratio/stand-by current of approximately 10 can be obtained by using such a load element. It is moreover stated in this article that, by connecting a pnp transistor across the load element, a further reduction of the stand-by current (4 μA) and hence of the dissipation can be obtained while maintaining the short access time, as a result of which it is possible inter alia to considerably increase the number of memory cells in a semiconductor body without the detrimental result of a corresponding increase in dissipation.

Due to the above-mentioned stability condition, the read current ratio/stand-by current in these cell also cannot be chosen arbitrarily large.

A further disadvantage of resistance elements is that they occupy a comparatively large space in the semiconductor body, and the space requirement increases as the resistance value is made higher. Reduction of the size of the resistance elements is often difficult in connection with the electrical properties of other circuit elements, and it makes the process of manufacturing the memory device more complicated. U.S. Pat. No. 3,585,412 describes a flip-flop circuit using as load elements Schottky diodes connected in the reverse direction which behave as resistors but occupy less space than the usual resistance elements. However, these diodes show the above-described disadvantages of linear resistance elements. Moreover, as a result of the provision of a Schottky diode with the desired reverse voltage characteristic, the manufacturing process of the device generally becomes considerably more complicated.

SUMMARY OF THE INVENTION

It is an object of the invention to provide a memory cell of the kind described above in which the read current/stand-by current ratio may be larger than in known cells of this type.

A further object of the invention is to provide a memory cell which has a compact construction and can be manufactured simultaneously by means of the usual process steps.

The invention is based inter alia on the recognition of the fact that a large read current/stand-by current ratio can be obtained when the voltage amplification ($dV_{ce}/dv_{be}$) per branch of the memory cell, at least within the current-voltage range in which it is possible to operate the device, is entirely or at least substantially entirely independent of the value of the electrical current. The invention is furthermore based inter alia on the recognition of the fact that such a current-independent voltage amplification can be obtained by using a rectifying junction as a load element the current-voltage characteristic of which in the forward direction comprises a factor $\exp(qV/mkT)$, where $m > 1$.

A memory cell according to the invention is characterized in that the load element comprises a p-n diode of which at least one of the anode and cathode regions is of polycrystalline silicon and in which the collector regions of the transistors are conductively connected to those regions of the diodes which are of the same conductivity type as the collector regions.

Experiments have demonstrated that p-n diodes consisting entirely or partly of polycrystalline material comprise an exponential factor $qV/mkT$ in their forward characteristic, where m is larger than 1.

This quantity m is a non-ideality factor which represents the deviation of this type of diode with respect to usual monocrystalline diodes. Probably as a result of inter alia the short life of minority charge carriers, m (which in monocrystalline diodes can be assumed to be substantially equal to 1) is larger than 1 and can be varied around m=2 within a certain range by appropriate selection of the method of manufacture. It can be easily determined that manufacture. It can be easily determined that when such a diode is used as a load element, the voltage amplification ($dV_{ce}/dV_{be}$) is substantially equal to m and hence is substantially independent of the current. Since the range within which this applies extends over a large number of decades, a very low value may be chosen for the stand-by current while nevertheless satisfying the stability condition. As a result of this the dissipation in the cell can be maintained at a very low level.

Since resistors are not necessary, the dimensions of each cell can be made very small so that the cell is particularly suitable for being integrated in a memory in large numbers. Moreover, as will become apparent from the description of the figures, the diodes can be manufactured by means of process steps which are conventionally used in semiconductor technology.

For the voltage difference $\Delta V$ between the collectors of the transistors it holds in the stable state to an approximation that $\Delta V=(mkT/q)$ in $\beta$ (at least in the usual case in which $\beta \geq 10$ and $m>1.5$), where $\beta$ is the current amplification of the transistors. The factor m of the diodes should be so large that $\Delta V$ is sufficiently large to maintain the stability of the cell with a given value of possible disturbances. In a preferred embodiment, therefore, diodes are used as load elements in which a voltage difference between the collectors of the transistors of at least 150 mV and preferably between 200 mV and 400 mV exists. Large voltage differences of, for example, 500 to 600 mV are preferably avoided because in this case the conductive transistor is saturated (bottomed) so that, as a result of charge storage, the write velocity of the cell is reduced. Very favorable results have been obtained in a construction with diodes in which $\Delta V$ was approximately 250 mV. In usual transistors in which the current amplification factor $\beta$ is between approximately 10 and 100, diodes are used with an m-factor which is approximately equal to 2. Diodes in which m is smaller than 1.5 are preferably avoided because the voltage difference between the collectors and hence the difference in logic levels between the two stable states then becomes too small in many cases.

In an important embodiment the diodes on either side of the p-n junction consist of polycrystalline silicon material. As will become apparent from the description of the figures, the diodes can be manufactured simultaneously with the provision of active zones in the monocrystalline semiconductor body via a previously grown polycrystalline silicon layer of a conductivity type which is opposite to that of the said active zones. In another embodiment which can be manufactured substantially entirely by means of standard methods, only one of the anode and cathode regions of the diodes is formed by polycrystalline silicon material, while the other region is formed at least substantially by a monocrystalline part of the semiconductor body which has a higher doping concentration, for example 10 times higher, than the polycrystalline part of the diode. The properties of these diodes do not differ much from those of polycrystalline diodes since the greater part of the injected charge carriers is injected, by the monocrystalline part of the diode, into the polycrystalline part where the recombination rate is comparatively high as a result of the doping concentration difference. Advantageously, the recombination rate can be increased by providing a metal layer above the p-n junction.

A first important embodiment of a memory cell in accordance with the invention is characterized in that the two transistors comprise two emitter regions which are connected to a supply line and two emitter regions which are connected to read/write lines and in which the collector regions are connected together via the said p-n junctions. This cell, which inter alia has the advantage that its mode of operation is very simple, in principle needs 4 lines, namely two supply lines or word lines and two read/write lines.

A second important embodiment of a memory cell in accordance with the invention which, as compared with the above-mentioned construction, is operated in a slightly more complicated manner but which has the advantage that in principle only three lines per cell are required, is characterized in that the transistors each comprise only one emitter region which is connected to the emitter region of the other transistor and the collector regions are connected to separate read/write lines via the said p-n diodes serving as load elements. A semiconductor memory comprising a semiconductor body having a surface-adjacent matrix of such memory cells arranged in rows and columns is characterized in that the surface has a system of crossing conductor tracks which form the said read/write lines and which are connected to p-n junctions in the rows and columns, respectively, of memory cells.

A particularly compact integration, due to the fact that the emitter regions per cell are common, can be obtained in a preferred embodiment which is characterized in that the transistors are formed by inverted transistors in which, viewed on the surface, the base region is situated below the collector region and the emitter region is situated below the base region of each transistor, and in which the semiconductor body comprises a number of juxtaposed, mutually separated strip-shaped regions of the first conductivity type which extend parallel to the rows or columns in the semiconductor body and form common emitter regions of the transistors belonging to the same row or column. A further favorable embodiment which presents important advantages both because the transistors themselves may be very small and because the p-n junctions do not require any extra process steps, is characterized in that the surface of the semiconductor body has an insulating layer which, at the area of the transistors, shows windows which define the base regions of the transistors and which are closed by a layer of polycrystalline silicon deposited in the windows and on the insulating layer and showing the same conductivity type as the base regions, the collector regions being situated below parts of the polycrystalline silicon layer of which the conductivity type has been changed by doping, said parts extending over the insulating layer and forming there the said p-n junctions with parts the conductivity type of which has not been changed by doping.

BRIEF DESCRIPTION OF THE DRAWING

The invention will now be described in greater detail with reference to several embodiments and the accompanying drawing, in which:

FIG. 4 is a cross-sectional view of the device shown in FIG. 3 taken on the line IV—IV;

FIG. 5 is a plan view of a part of another embodiment of a memory matrix according to the invention;

FIG. 6 is a sectional view of this device taken on the line VI—VI;

It is to be noted that the figures are diagrammatic and are not drawn to scale.

DETAILED DESCRIPTION

Figure 1:
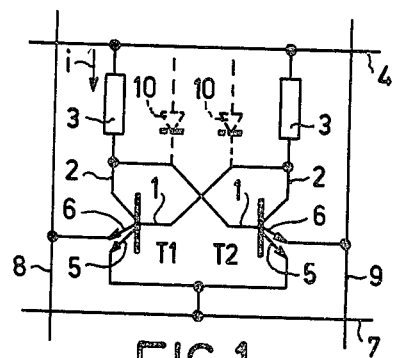
FIG. 1 is a circuit diagram of a known flip-flop memory cell.

FIG. 1 shows the circuit diagram of a static memory cell of a known type having two transistors T1 and T2, the base and collector regions 1 and 2, respectively, of which are interconnected crosswise. The collectors 2 are connected, via load elements 3, to a supply line 4 which in the case of a memory is used as a word line. The transistors each comprise two emitter regions 5 and 6, the emitter regions 5 being connected to the (word) line 7 and the emitter regions 6 being connected to the write/read lines 8 and 9. In most conventional known constructions the load elements 3 simply consist of resistors.

During operation, a comparatively large current i is passed through the cell for reading in connection with a desired reading velocity, and a smaller current is passed in the stand-by condition to restrict dissipation. These different current values lead to different desired values for the impedances 3, as will become apparent hereinafter.

The starting requirement is that in the metastable point, per branch, it should hold for a stable flip-flop circuit for the gain factor that:

$$(dV_{ce}/dV_{be}){:}(dV_{ce}/dV_b) > 1, \tag{1}$$

where $\Delta V_c$ and $\Delta V_b$ are voltage variations at the collector and the base regions, respectively. For the emitter-base junction of the transistors T1, T2 the diode equation $$i_c = I_o \exp(qV_{be}/kT) \tag{2}$$

holds to an approximation, wherein $i_c$ is the collector current, q the elementary quantity of charge, $V_{be}$ is the forward voltage across the emitter-base junction, k is Boltzmann's constant and T is the absolute temperature. From equation (2) it can be derived that with a voltage variation $\Delta V_{be}$ for the current variation i it holds that:

$$\Delta i_c = (qI_c)/(kT)\Delta V_{be}. \tag{3}$$

For the case in which the elements 3 simply consist of resistors having resistance values R, it follows from equations (1) and (3) that:

$$R > (kT)/(qi). \tag{4}$$

The minimum value of R thus depends on the current in the sense that with a large current a small resistance will suffice, whereas with a small i the resistance R should be large.

Since in practice the voltage difference between the collectors of the transistors usually is preferably at least 100 to 150 mV, the ratio between the read current and the stand-by current will usually be fairly low (smaller than 10).

It is known that the dissipation can be reduced, as already described above, by using a non-linear resistance element which can be obtained, for example, by connecting a diode in parallel across the resistor as is shown in FIG. 1 in broken lines. With such a non-linear resistance element in which the differential resistance decreases when the value of the current increases, a considerable improvement in the read current stand-by current ratio can be effected. However, a further increase of the read current/stand-by current ratio is often desired.

From the point of view of packing density, further resistance elements having large resistance values are undesired due to the comparatively large space they use to occupy in the semiconductor body.

Figure 2:
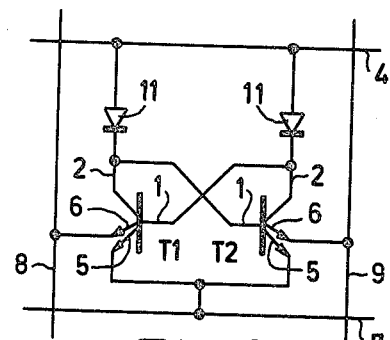
FIG. 2 is a circuit diagram of a flip-flop memory cell according to the invention.

FIG. 2 shows a circuit diagram of a flip-flop cell according to the invention. Instead of resistors 3 the cell comprises load elements comprising diodes 11, the cathodes of which are connected to collector regions 2 of the transistors T1 and T2 and the anodes of which are connected to the word line 4 so that during operation the diodes are forward-biased. In order to obtain a sufficiently large impedance which, on the basis of the stability condition imposed in equation (1), should be larger than that of the emitter-base junction, at least one of the anode and cathode regions of the diodes 11 is made of polycrystalline silicon. This type of diodes shows a current-voltage characteristic which (within a certain range) can be described by $$i_d = I_o \exp(qV)/(mkT), \tag{5}$$

where m > 1. It can be simply determined that in this case it holds for amplification, from equation (1), that:

$$(\Delta V_{ce})/(\Delta V_{be}) = m. \tag{6}$$

Within the current-voltage range wherein the diode equation (5) applies, the voltage gain $(\Delta V_{ce})/(\Delta V_{be})$ is substantially independent of the current and is larger than 1, so that the stability condition in the metastable point that the loop gain should be larger than 1 is satisfied. Because the range within which this applies generally is very large (5 to 6 decades), the current can be varied over a large range, which means that the read current can be very large (1 mA), and the stand-by current can be very small and can even be selected to in the order of magnitude of 1 mA while the cell nevertheless remains stable.

When a current i is passed through the conductive transistor and the current gain β of the transistors shows a usual value (for example at least 20), a current of substantially i/β which forms the base current for the conductive transistor flows through the diode 11 which is connected to the non-conductive transistor. It can be derived from equation (5) that the voltage difference $\Delta V$ between the collector regions 2 of the transistors is equal to $(mkT)/(q) \ln \beta$, and hence (at least in 1° order) is substantially not dependent on the current. The voltage difference $\Delta V$ should be so large that with a given value of noise the cell nevertheless remains stable. With a given value of the current gain factor $\beta$, therefore, diodes 11 are used having such a factor m that $\Delta V$ is at least approximately 150 mV and preferably at least approximately 200 mV. An upper limit of preferred values of the quantity m is determined inter alia by the velocity of the memory cell. The conductive transistor which is saturated can become bottomed at a large voltage difference, for example, a voltage difference of 500 to 600 mV, so that the writing velocity is reduced. Therefore, the m-factor of the diodes 11 preferably has at most such a value that, at a given value of $\beta$, the voltage difference $\Delta V$ between the collector regions 2 is at most 500 mV. Favorable results have been obtained in practical constructions with diodes having an m-factor of at least 1.3 and approximately equal to 2 in transistors having a $\beta$ in the order of magnitude between 30 and 100, so that a voltage difference $\Delta V$ was built up of approximately 150 to 250 mV.

Figure 3:
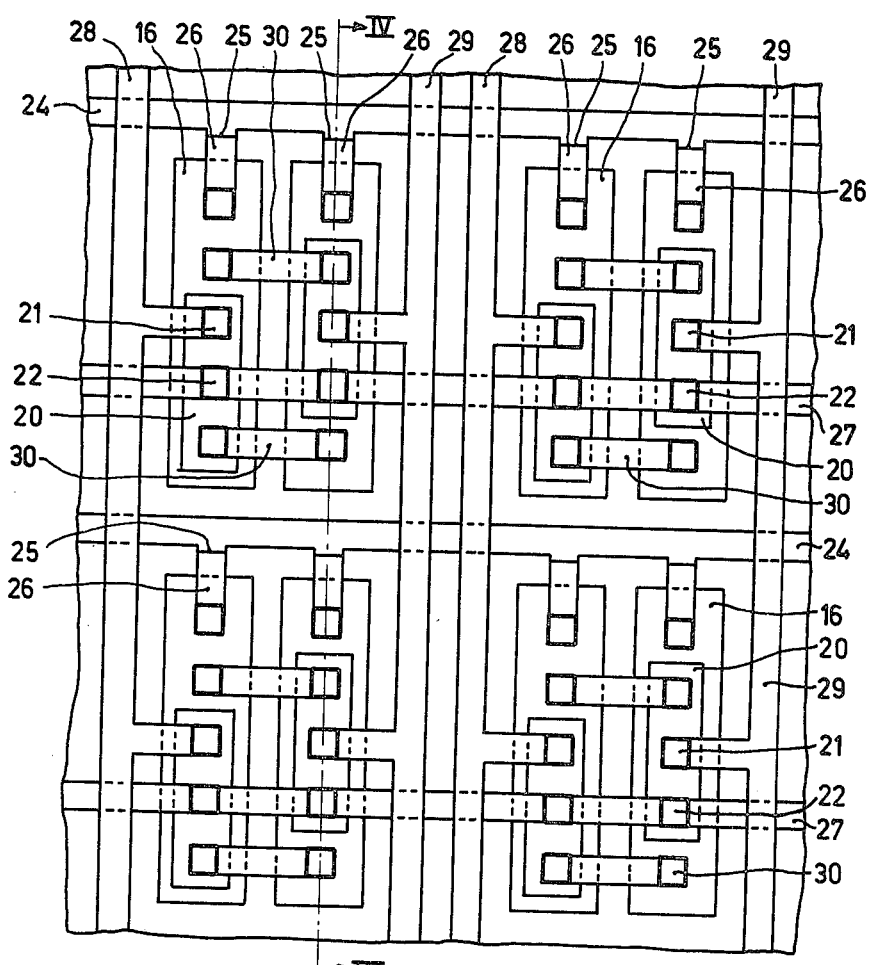
FIG. 3 is a plan view of a part of a memory cell according to the invention.

FIGS. 3 and 4 are a plan view and a sectional view, respectively, of a part of a practical embodiment of a memory in accordance with the invention. The device comprises a semiconductor body 12 of a conventional construction consisting of a p-type substrate 13 and an n-type epitaxial layer 14 adjoining the upper surface 15. A number of islands 16 are formed in the epitaxial layer and are arranged in groups of two which comprise the transistors of a memory cell. Within the epitaxial layer the islands 16 are bounded by insulation regions 17 which in this case are formed by p-type zones provided in the layer 14 but which, of course, may also consist of insulating material, for example, silicon oxide, sunk in the semiconductor body and obtained by local oxidation of the epitaxial layer 14. The islands 16 themselves constitute with the highly doped buried n-type layers 18 at the interface between the epitaxial layer and the substrate and in the highly doped n-type collector contact zone 19 the collector regions of the transistors. In the usual manner the base regions in the form of the p-type surface zones 20 and the emitter regions in the form of the n-type surface zones 21 and 22 are provided in the islands 16 by means of diffusion or ion implantation. The surface 15 is covered with an insulating layer 23 having windows to provide contacts with the emitter base and collector regions of transistors.

It is to be noted that the transistors in FIG. 3 are shown only very diagrammatically. For example, the buried layers 18 are not shown and the contours of the emitter regions 21 and 22 and the collector contact zones 20 which coincide substantially with the contours of the contacts between said regions and the word lines and the read/write lines are not shown either.

A pattern of conductor tracks 24 of p-type polycrystalline silicon is formed on the oxide layer 23, which tracks change into collector connections 26 of n-type polycrystalline silicon via the p-n junctions 25 forming the load elements of the flip-flop, as described with reference to FIG. 2. The tracks 24 form one of the word lines of the memory corresponding to the lines 4 in FIG. 2. The word lines corresponding to the lines 7 in FIG. 2 are formed by the conductor tracks 27 which are connected to the emitter regions 22 and, as the collector connection 26, may be constructed from n-type polycrystalline silicon. The emitter regions 22 are connected to read/write lines 28, 29 extending in the column direction. These lines may be constructed in a second layer of wiring, for example of Al, which is insulated electrically from the lines 24, 27 by an intermediate oxide layer. The crossing connections 30 between the base regions 20 and the collector regions 16 of the transistors may also be manufactured in this layer of wiring.

The polycrystalline silicon material of the word lines 24 and 27 is formed in known manner by decomposition of $SiH_4$ at low pressure (approximately 0.5 mm Hg) at a temperature of approximately 640° C. The growth rate was approximately 100 Å/min. In these circumstances, polycrystalline silicon material was obtained, the factor m of which was approximately equal to 2. However, the process conditions may be varied such that the polycrystalline material differs more or less from monocrystalline silicon, for example, by changing the growth rate so that the grain size and the concentration of trapping centers and hence also the m factor changes. In general it may be said that the various process parameters can simply be chosen by those skilled in the art in such manner that diodes having properties which are most favorable for a given application are obtained.

FIGS. 5 and 6 are a plan view and a sectional view, respectively, of a modified embodiment of the above-described memory matrix. Only one memory cell of the matrix is shown in these figures but it will be obvious that a memory matrix of memory cells as shown in FIG. 5 can be obtained in the same manner as in the preceding embodiment. Furthermore, in these figures the same reference numerals are used for corresponding components as in the preceding embodiment.

In contrast with the preceding embodiment, only one of the anode and cathode regions is of polycrystalline silicon, while the other region is formed at least substantially by a monocrystalline part of the semiconductor body. For this purpose, the polycrystalline word lines 24 are situated immediately above the collector regions 16 and, at the area of windows in the oxide layer 23, adjoin the collector regions 16 of the transistors. The polycrystalline paths 24 which, as in the preceding embodiment, are of the p-conductivity type, form the p-n junctions 31 with the collector regions 16 substantially at the area of the interface between the polycrystalline and the monocrystalline material. These p-n junctions, like the p-n diodes 11 in the preceding embodiment, form the load elements of the memory elements. In order to obtain a suitable gain, for this purpose the doping concentration on the monocrystalline cathode side of the diode is chosen to be higher, preferably at least 10× higher, than on the polycrystalline side. At least for the purpose for which they are used here, the characteristics of such diodes prove to have substantially the same properties as diodes containing both an anode and a cathode of polycrystalline silicon. An explanation for this is that at the given concentration difference between the anode and the cathode, the greater part (for example 90%) of the current across the diode is formed by charge carriers (electrons) which are injected into the polycrystalline paths 24 from the collector 16 and, in particular as a result of the recombination centers present there to a comparatively large extent, disappear again by recombination. The desired concentration difference can be obtained in a very simple manner by providing, at the area of the p-n diodes 31, a highly doped low-ohmic collector contact zone 19 which is usual in conventional circuits and has a doping concentration of $10^{20}$–$10^{21}$ atoms/cm$^3$ and choosing the doping concentration of the polycrystalline paths 24 to be between approximately $10^{18}$ and $10^{19}$.

Since the word lines 24 are situated immediately above the collector contact windows in the oxide layer, the dimensions of the cell can be particularly small.

Figure 14:
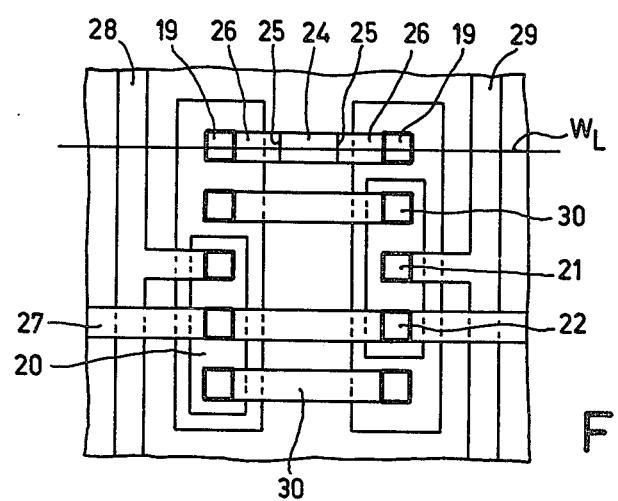
FIG. 14 is a plan view of a further embodiment of a memory cell in accordance with the invention.

In those cases in which it is important for the resistance in the word lines to be kept low, a layer of a readily conductive material, for example aluminum, may be provided on the polycrystalline paths 24. However, the word lines may also be substantially entirely of aluminum and also comprise only locally strips of polycrystalline silicon in which the p-n junction is formed. FIG. 14 is a diagrammatic plan view of such a manifold embodiment. The word lines are shown diagrammatically by a line WL and are formed by tracks of Al extending from the left to the right above the semiconductor body. The p-n diodes 25 are formed in strips 24, 26 of polycrystalline silicon extending only between the collector contacts 19. These strips comprise a p-type portion 24 which is contacted with the Al strip WL, and an n-type portion 26 which is connected to the collector contact zone 19 and is insulated from the word line WL by an insulating layer of, for example, silicon oxide.

In the memory device described so far, each cell comprises at least four address lines, namely two bit-/read lines and two word lines which also ensure the supply of the cell. The following embodiment relates to a memory in which the supply of the memory cells is provided at least partly by one of the bit lines so that only three lines per cell will suffice instead of four and hence a further reduction of the space which the memory occupies in the semiconductor body can be obtained.

Known memory cells of this type having only three address lines are described inter alia in the article "A four device bipolar memory cell" by Raymond A. Heald, published in IEEE International Solid State Circuits Conference, 1978, pp 102-103. These known memory cells comprise as load elements in the collector tracks of the cross-coupled inverter transistors complementary transistors which are of the npn type.

According to the invention, poly-poly p-n diodes or poly-mono p-n diodes are used as load elements the forward characteristic of which comprises a factor exp (qV/mkT) where m is larger than 1, so that again a particularly simple and compact configuration can be obtained.

Figure 7:
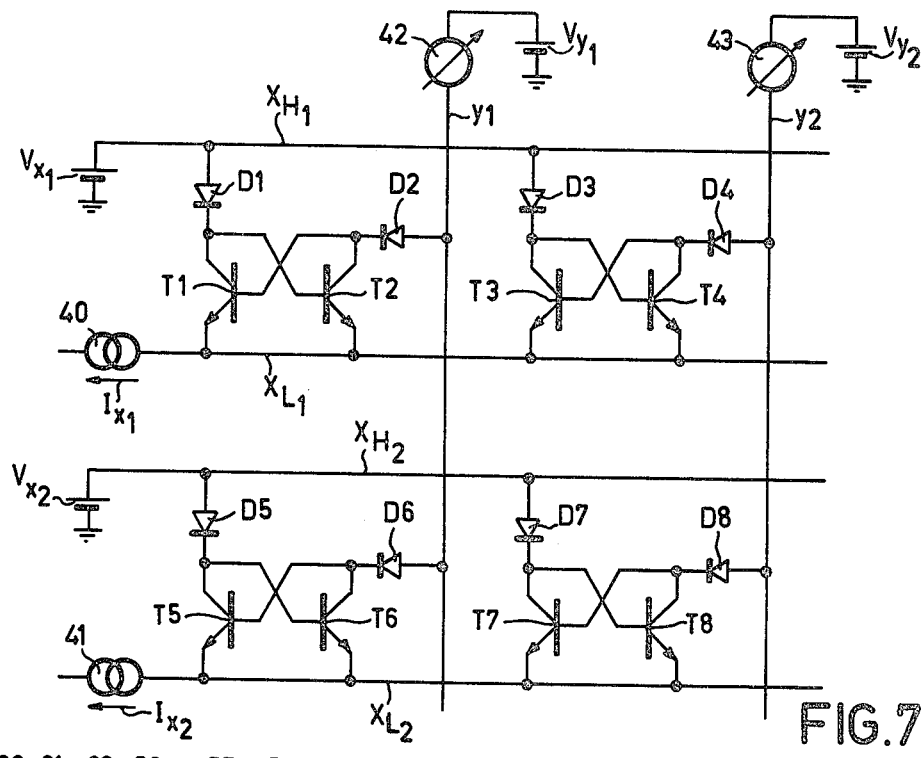
FIG. 7 is a schematic diagram of a part of a memory according to another embodiment of the invention.

FIG. 7 shows a circuit diagram of a part of a matrix configuration. The transistors $T_1$–$T_8$ each comprise only one single emitter since the supply lines also fulfil at least partly the function of bit lines. The supply line $X_{L1}$, $X_{L2}$ etc. connects the emitters of the cells of a word to a current source 40, 41. The word lines $X_{H1}$, $X_{H2}$ connect the anodes of the diodes $D_1$, $D_3$, $D_5$, $D_7$ to voltage sources $V_{x1}$, $V_{x2}$, etc. The lines $Y_1$, $Y_2$ etc. connect the cells in the same manner column-wise to the voltage sources $V_{y1}$, $V_{y2}$ etc. The Y lines are moreover connected to read means 42, 43, which for simplicity are shown as ammeters.

The device may be operated, for example, as follows:

Stand-by: In the quiescent state the voltages $V_X$ and $V_Y$ are assumed to be equal. The cells are in one of the two stable states. For example, when the cell with the transistors $T_1$ and $T_2$ and the diodes $D_1$ and $D_2$ is chosen as an example, much or little current passes through the diode $D_1$, dependent on the state of the cell, namely either a base current (to $T_2$) or a collector current (to $T_1$).

Writing: Assuming the cell to be in that condition in which the transistor $T_1$ conveys current, the cell may be set in a different state by increasing $V_{X1}$ and simultaneously reducing $V_{Y1}$, so that the collector current through $T_1$ is increased and the base current to $T_1$ is reduced, respectively. With a given voltage variation the base current to $T_1$ becomes so small that the transistor $T_1$ is cut off for lack of sufficient amplification. The transistor $T_2$ will become conductive. For the right-hand neighboring cell ($T_3$, $T_4$) only $V_{X1}$ is increased and for the neighboring cell ($T_5$, $T_6$) only $V_{Y1}$ is increased. With a suitable choice of the voltage variation this half selection is insufficient to switch said cells. It is not necessary to increase the currents $I_{X1}$, $I_{X2}$, etc. during writing, but the velocity of writing can be increased in this manner.

Reading: Because upon reading a given cell the other cells in the same column also provide a contribution to the overall current through the Y lines, it is advantageous to give the selected row much more current than the other rows, by means of the current sources 40, 41 etc. The information may then be read by finding out via the means 42 whether a comparatively low base current flows through the relevant Y line or a high collector current. This difference may be additionally emphasized by making $V_x$ higher than $V_y$.

In principle a whole row is read simultaneously but it may be ensured by means of a post-selection that the information of only one cell emanates.

The voltage difference $\Delta V$ which is to be applied between the associated $X_L$ and y lines for writing information in a given cell will depend both on the factor m and on $\beta$. In the table below, for various values of $\beta$ and m=2, the associated values of $\Delta V$ are recorded obtained from computer simulations.

| $\beta$ | $\Delta V$ (mV) |
|---|---|
| 1000 | 144 |
| 100 | 82 |
| 30 | 52 |
| 20 | 40 |
| 10 | 24 |

These values prove substantially to satisfy the general equation:

$$\Delta V = (kT)/(q) \ln \beta - 2(kT)/(q) \ln 2,$$

to be determined analytically.

For a specific value of $\beta$ of approximately 30, this voltage is approximately 52 mV. For writing, in which each time the condition of one single cell may be flipped over, a voltage $\pm \Delta V$ is applied to the x and y lines. 40 mV may be chosen, for example, for this $\Delta V$. Writing may therefore be carried out as follows:

Write "1" $V_{x1} = +40$ mV, $V_{y1} = -40$ mV→$T_2$ conducts

Write "0" $V_{x1} = -40$ mV, $V_{y1} = +40$ mV→$T_1$ conducts.

Figure 9:
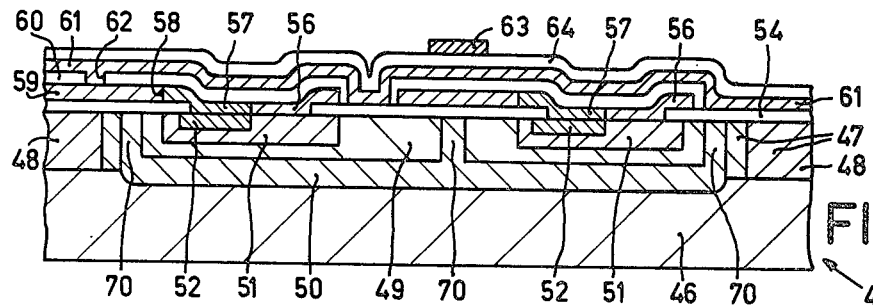
FIG. 9 is a sectional view taken on the lines IX—IX of FIG. 8.
Figure 10:
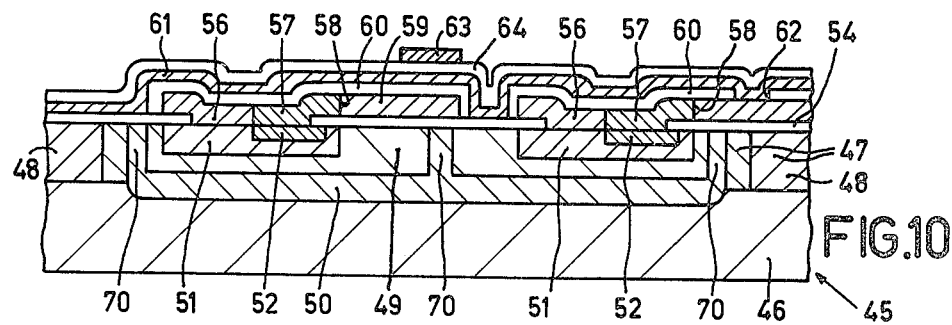
FIG. 10 is a sectional view taken on the line X—X of FIG. 8.
Figure 8:
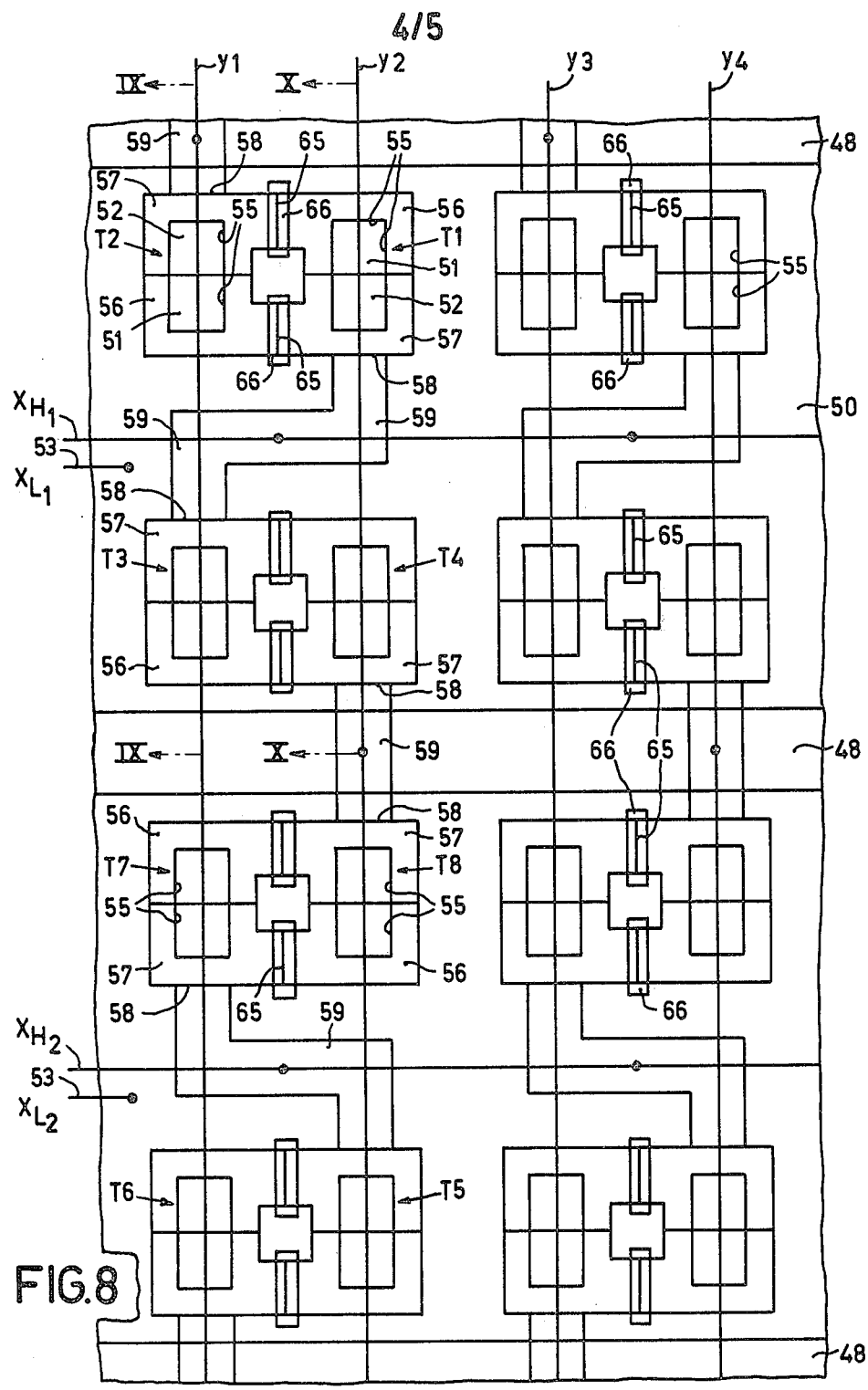
FIG. 8 is a plan view of a part of a memory according to the diagram of FIG. 7.

FIG. 8 and FIGS. 9 and 10 are a plan view and sectional views, respectively, of a part of a semiconductor device having a matrix of the above-described memory cells. The device comprises a semiconductor body 45 of the usual composition having a substrate 46 of p-type silicon and a layer 47 of n-type silicon deposited thereon. A number of islands 49 separated from each other by p-type zones 48 are formed in said epitaxial layer and, in the plan view shown in FIG. 8, extend from the left to the right. Highly doped buried n-type zones 50 corresponding to the address lines $X_{L1}$, $X_{L2}$ etc., of the transistors of the memory cells, to be operated inversely, are provided between the islands 49 and the substrate 46. The p-type zones 51 are provided in the n-type islands and form the base zones of the transistors $T_1$, $T_2$, $T_3$ etc., and the n-type surface zones 52 are provided in the p-type zones 51 and form the collectors of the transistors. It is to be noted that the transistors of the memory cells associated with a common word line $X_L$ are provided in a common island due to the fact that the transistors are used inversely, the lowermost n-type region 50 serving as emitter and the uppermost n-type region 52 serving as collector region. In addition to important other advantages, said inversion permits a particularly compact structure of the memory matrix since, unlike in the preceding embodiments, all transistors are provided in a separate island. As shown in the sectional views of FIGS. 9 and 10, highly doped n-type zones 70 are furthermore provided in the islands 49 and surround the base zones 51 and, by way of example, extend from the surface down to the buried zones 50. In known manner the current gain of the inverse transistors can be improved by means of said zones, while in addition parasitic lateral pnp action between the base regions can be avoided.

The buried zones (50, $X_L$) can be contacted in known manner at the edge of the islands 49 beyond the part of the semiconductor device shown in the figures, which is shown diagrammatically in FIG. 8 by the connection wires 53.

Apart from the contacts 53 for the emitter regions 50, the transistors $T_1$, $T_2$, $T_3$, etc., are connected through a window in the oxide layer 54 which covers the epitaxial layer 47. Via this aperture, referenced 55 in FIG. 8, both the base zones 51 and the collector zones 52 are provided with an electric connection. These connections are denoted by reference numerals 56 and 57, respectively, and are formed by layers of p-type and n-type silicon, respectively, deposited in the windows 55 and on the oxide layer 54. The way in which this type of transistor can be manufactured will be described hereinafter.

The collector connections 57 change into p-type silicon paths 59 via the p-n junctions 58. The n-type silicon connections 57, at least in so far as they are not situated in the windows 55 in the oxide layer 54 immediately above the collector regions 57, and the p-type silicon paths 59 are again of a polycrystalline structure so that the p-n junctions 58 which correspond to the diodes D in the circuit diagram of FIG. 7, show a characteristic which makes them suitable to serve as collector load elements.

The polycrystalline paths 57, 59 are covered with an insulating layer 60 obtained by deposition from the gaseous phase or by partial oxidation of polycrystalline silicon material. Conductor tracks 61 are provided on the oxide layer 60 and extend in the column direction of the matrix and are connected, via windows 62, to the p-type silicon tracks 59 of one of the diodes in each cell. The paths 61 which correspond to the Y-lines in the circuit diagram shown in FIG. 7 and which are shown diagrammatically only in the plan view, may be, for example, of Al. In the same manner, the p-type paths 59 which as anodes are associated with the other diodes in the cells are connected by Al paths 63 extending in the row direction transversely to the column direction of the matrix. These paths which correspond to the X lines in FIG. 7 and which are shown diagrammatically only in FIG. 8, cross the Y lines 61 and may be electrically insulated herefrom by an intermediate layer 64 of, for example, silicon oxide or aluminum oxide or any other suitable dielectric.

In FIG. 8 the contacts between the $X_L$ lines and the p-type polycrystalline silicon material 59 are denoted by dots.

The polycrystalline silicon may also be used to form the crossing connections between the collector and base regions of the two transistors in a cell. Because the polycrystalline silicon above the collector region of one transistor is n-type and the silicon 56 above the base region of the other transistor is p-type, in the case in which these two polycrystalline layers 56, 57 adjoin each other and form a parasitic p-n junction 65 (see. FIG.), a metal connection 66, for example of Al, is provided on the polycrystalline silicon and interconnects these two parts 56, 57 of different conductivity types and, in the present embodiment, shortcircuits the parasitic p-n junction 65.

Figure 11:
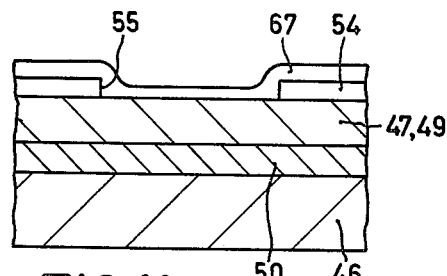
FIGS. 11 to 13 are sectional views of a transistor used in the memory shown in FIG. 8 during several stages of the manufacture thereof.
Figure 12:
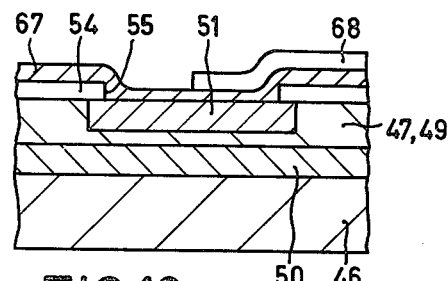
Figure 13:
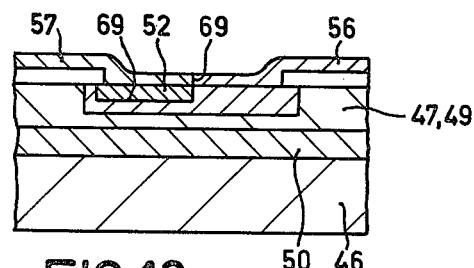

For the manufacture of the semiconductor structure, generally known techniques may be used substantially entirely which need not be further described here. For the manufacture of the transistors, reference is made in particular to Applicants' Netherlands Patent Application No. 7612883 (PHN 8601), which corresponds to U.S. Pat. No. 4,161,745, the contents of which is incorporated in this application by reference. FIGS. 11–13 show several stages in the manufacture of such a transistor. FIG. 11 is a sectional view of a part of the semiconductor body in which the transistor is to be provided after the n-type epitaxial layer 47 has been provided on the p-type substrate 46 with the buried n-type layer 50 between the substrate and the layer 47 and the island insulation not shown in the drawing. The aperture 55 is formed in the oxide layer 54 on the surface of the semiconductor body by means of known photolithographic methods. The aperture 55 which defines the base zone of the transistor is then closed again by means of the layer 67 of silicon which on the surface of the epitaxial layer 47 shows a monocrystalline or polycrystalline structure and on the oxide layer 54 shows a polycrystalline structure. Paths or tracks which correspond to the polycrystalline conductor pattern 56, 57 shown in the plan view of FIG. 8 may be formed from the silicon layer 67. The remaining parts of the silicon layer may be removed by etching or may be converted into silicon oxide by oxidation.

The remaining silicon layer 67 may then be doped with a p-type impurity, for example boron, by means of diffusion or by ion implantation methods. At the area of the apertures 55 in the oxide layer 54 the boron also penetrates into the epitaxial layer 47 and forms there the p-type base zone (FIG. 12). The silicon layer 67 is then partly covered with a masking layer 68 which extends partly in the aperture 55 and further above those parts of the layer 67 which are to form the p-type polycrystalline paths 59. The exposed part of the polycrystalline layer 67 is then doped with an n-type impurity, for example phosphorus, by means of implantation. At the area of the window 55 in the oxide layer the impurity diffuses in the semiconductor body and forms there the n-type collector zone 52, FIG. 13. The p-n junction 69 between the base zone 51 and the collector 52 extends into the layer 67 and divides said layer into an n-type portion 57 and a p-type portion 56, forming a collector connection and a base connection, respectively. Simultaneously with the p-n junction 69 the p-n junctions 58 serving as load elements are formed between the n-type collector connections 57 and the p-type strips 59.

By deposition from the gaseous phase or by oxidation of the polycrystalline silicon strips, the oxide layer 60 may then be provided after which the Al paths $X_L$ and Y may be formed in the usual manner.

It will be apparent that the invention is not restricted to the embodiments described but that many variations are possible to those skilled in the art without departing from the scope of this invention.

For example, the conductivity types of the various zones and regions may be reversed, pnp-transistors being used instead of npn-transistors.

In order to obtain a higher packing density all the emitter regions in the last example could be connected to one common current source. Not much changes for writing. Upon reading, however, the overall interference contribution is much larger than the signal. In order nevertheless to be able to read, a dynamic read amplifier may be used. The operation then becomes as follows: If all the X lines are kept constant, the interference contribution is unknown but is constant. By increasing $V_{X1}$ by a certain voltage, too small to change the condition of the connected cells, a current increase in Y will be visible, if $T_2$ conducts ("1") and no current change if $T_1$ conducts ("1"). So the reading amplifier should be sensitive to small variations superimposed on an—unknown—large direct current.

Reading of the cells in the first embodiment may also be done in known manner via a diode connected to the collector of the transistors.

What is claimed is:

1. A memory cell for use in an integrated static memory circuit, which comprises a semiconductor body having two transistors with cross-coupled base and collector regions, and a diode load element connected to each collector region, characterized in that each diode load element comprises a p-n junction diode of which at least one of the anode and cathode regions comprises polycrystalline silicon, and each collector region is connected to that region of its associated diode load element which is of the same conductivity type as the collector region.

2. A memory cell as claimed in claim 1, characterized in that the current-voltage characteristic of the diodes comprises an exponential term (qV/mkT), where q is the elementary quantity of charge, V is the voltage, k is Boltzmann's constant and T is the absolute temperature, and in which m is such that at room temperature during operation a voltage difference is at least 150 mV is present between the collectors.

3. A memory cell as claimed in claim 2, characterized in that diodes are used in which the voltage difference between the collectors is between 150 and 500 mV.

4. A memory cell as claimed in claim 2 or 3, characterized in that m is set at least approximately 1.3.

5. A memory cell as claimed in claim 2, characterized in that the quantity m is at least approximately 1.5.

6. A memory cell as claimed in claim 1, characterized in that both the anode and cathode regions of the diodes comprise polycrystalline silicon material.

7. A memory cell as claimed in claim 1, characterized in that only one of the anode and cathode regions is of polycrystalline silicon material and the other region comprises a monocrystalline part of the semiconductor body, the doping concentration in the said other monocrystalline region of the diode being higher than the doping concentration in polycrystalline region of the diode.

8. A memory cell as claimed in claim 7, characterized in that the doping concentration in the monocrystalline region of the diode is at least approximately 10 times higher than in the polycrystalline region.

9. A memory cell as claimed in claim 1, characterized in that the collectors of the transistors are connected to a first supply line via the diodes serving as load elements and the emitter regions of the transistors are connected to a second supply line.

10. A memory cell as claimed in claim 9, characterized in that the transistors each comprise a second emitter region which is connected to a read/write line.

11. A semiconductor device comprising a matrix system of memory cells as claimed in claim 9 or 10, characterized in that the semiconductor body for each memory cell comprises two juxtaposed mutually insulated surface-adjoining island-shaped regions of a first conductivity type which are bounded on their lower side by a substrate of a second conductivity type opposite to that of the first, the island-shaped regions, which each form a collector region of a transistor, having a surface zone of the second conductivity type which forms the base region of the associated transistor and is provided with at least a surface zone of the first conductivity type which forms said emitter region of the transistor, the surface of the semiconductor body being covered with an insulating layer having a track of polycrystalline silicon of the second conductivity type thereon which, via said p-n junctions and via windows in the insulating layer, is connected to the collector regions of the transistors.

12. A semiconductor device as claimed in claim 11, characterized in that the track of polycrystalline silicon is situated above the contact windows of the collector regions and forms with the collector regions junctions between polycrystalline and monocrystalline silicon material substantially coinciding with the said p-n junctions.

13. A semiconductor device as claimed in claim 12, characterized in that at the area of the contact windows the collector regions have a highly doped surface zone of said first conductivity type which has a higher doping concentration than the part of the collector regions surrounding said zone.

14. A semiconductor device as claimed in claim 12 characterized in that metal tracks are provided on the polycrystalline silicon at least above the contact windows of the collector regions.

15. A semiconductor device as claimed in claim 11, characterized in that at the area of the contact windows in the insulating layer the collector regions of the transistors are conductively connected to parts of the track of polycrystalline silicon of said first conductivity type which, via said p-n junctions, change into portions of the second conductivity type situated beside the contact windows.

16. A memory cell as claimed in claim 1, characterized in that each transistor comprises only a single emitter region which is connected to the emitter region of the other transistor of its memory cell and the collector regions are connected to separate read/write lines via said p-n diodes which serve as load elements.

17. A semiconductor device comprising a semiconductor body having a surface-adjoining matrix of memory cells arranged in rows and columns as claimed in claim 16, characterized in that the surface has a system of crossing conductor tracks forming said read/write lines which are connected to p-n junctions in the rows and columns, respectively, of memory cells.

18. A semiconductor device as claimed in claim 17, characterized in that the transistors are inverted transistors in which, viewed on the surface, each base region is situated below its corresponding collector region and each emitter region is situated below its corresponding base region, the semiconductor body having a number of juxtaposed mutually separated strip-shaped regions of the first conductivity type extending parallel to a selected one of the rows or columns in the semiconductor body and forming a common emitter region of the transistors belonging to the same row or column.

19. A semiconductor device as claimed in claim 17 or 18, characterized in that the surface of the semiconductor body has an insulating layer which at the area of the transistors comprises windows which define the base regions of the transistors and which are closed by a layer of polycrystalline silicon which is deposited in the windows and on the insulating layer and is of the same conductivity type as the base regions, the collector regions being situated below parts extending over the insulating layer and the conductivity type of which has been changed by doping and forming said p-n junctions there with a part of a conductivity type which has not been changed by doping.

20. A semiconductor device as claimed in claim 19, characterized in that the crossing connections between the collector and base regions in each memory cell are also formed by parts of the polycrystalline silicon layer in which p-n junctions are situated which are short-circuited by an overlying metal layer.

* * * * *

UNITED STATES PATENT AND TRADEMARK OFFICE
CERTIFICATE OF CORRECTION

PATENT NO. : 4,322,821

DATED : March 30, 1982

INVENTOR(S) : Jan Lohstroh and Cornelis M. Hart

It is certified that error appears in the above-identified patent and that said Letters Patent are hereby corrected as shown below:

Col. 13, line 55, change "is" to --of--

Col. 13, line 61, delete "set"

Col. 14, line 5, after "in" insert --the--

Signed and Sealed this

Twenty-second Day of June 1982

[SEAL]

Attest:

GERALD J. MOSSINGHOFF

*Attesting Officer*     *Commissioner of Patents and Trademarks*